(12) United States Patent
Kirchhoff et al.

(10) Patent No.: US 6,380,074 B1
(45) Date of Patent: Apr. 30, 2002

(54) DEPOSITION OF VARIOUS BASE LAYERS FOR SELECTIVE LAYER GROWTH IN SEMICONDUCTOR PRODUCTION

(75) Inventors: Markus Kirchhoff, Ottendorf-Okrilla; Hans-Peter Sperlich; Uwe Schilling, both of Dresden; Zvonimir Gabric, Zorneding; Oswald Spindler, Vaterstetten; Stephan Wege; Hans Glawischnig, both of Dresden, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/666,526

(22) Filed: Sep. 18, 2000

(30) Foreign Application Priority Data

Sep. 17, 1999 (DE) .......................... 199 44 740

(51) Int. Cl.⁷ .......................... H01L 21/4763
(52) U.S. Cl. .................. 438/637; 438/631; 438/633; 438/669; 438/692
(58) Field of Search ................. 438/637–640, 438/631, 632, 633, 669, 690–692

(56) References Cited

U.S. PATENT DOCUMENTS

| | | | | |
|---|---|---|---|---|
| 5,124,275 A | * | 6/1992 | Selle et al. .................. | 438/320 |
| 5,915,190 A | * | 6/1999 | Pirkle .......................... | 438/424 |
| 6,008,107 A | * | 12/1999 | Pierce et al. ................. | 438/427 |
| 6,200,865 B1 | * | 3/2001 | Gardener et al. ........... | 438/291 |

FOREIGN PATENT DOCUMENTS

| | | | | |
|---|---|---|---|---|
| DE | 196 31 743 A1 | 12/1998 | | |
| EP | 0 537 001 A1 | 4/1993 | | |
| JP | 04211148 | * | 3/1992 | .......... H01L/21/90 |
| JP | 6-204332 | 7/1994 | | |
| JP | 8-125008 | 5/1996 | | |

* cited by examiner

*Primary Examiner*—Charles Bowers
*Assistant Examiner*—Thanh Nguyen
(74) *Attorney, Agent, or Firm*—Herbert L. Lerner; Laurence A. Greenberg; Werner H. Stemer

(57) ABSTRACT

A method for the shrink-hole-free filling of trenches in semiconductor circuits which utilizes selective growth of a layer to be applied is described. In the method, a layer of a selective growing material is applied simultaneously to a growth-promoting layer and to a growth-inhibiting layer. Wherein raised portions which, before the layer of selective growing material is applied, are covered by the growth-inhibiting layer at least on their sides. After the growth-inhibiting layer has been applied, the growth-promoting layer is generated by anisotropic treatment on surfaces parallel to the substrate on and between the raised portions and the layer is then removed again on surfaces parallel to the substrate on the raised portions. The method makes it possible to produce in a particularly simple manner a pattern on the raised portions of which are covered by the growth-inhibiting layer on their sides and on their top whereas the bottom of trenches is covered with a growth-promoting layer.

11 Claims, 2 Drawing Sheets

DEPOSITION OF VARIOUS BASE LAYERS FOR SELECTIVE LAYER GROWTH IN SEMICONDUCTOR PRODUCTION

BACKGROUND OF THE INVENTION

Field of the Invention

The invention relates to a method preferably for shrink-hole-free filling of trenches in integrated semiconductor circuits by utilizing selective growth of a layer to be applied. In which a layer of a selectively growing material is applied simultaneously to a growth-promoting layer and to a growth-inhibiting layer, wherein largely flattened raised portions which, before the layer of the selectively growing material is applied, are covered by the growth-inhibiting layer at least on their sides.

Such a method is known from Published, Non-Prosecuted German Patent Application DE 196 31 743 A1. In this document, a method is described in which a first insulating layer is applied to a semiconductor substrate and a metal layer is deposited thereupon and patterned so that raised portions in the form of conductor tracks are produced on the first insulation layer. This pattern is covered with a second insulation layer that is then removed on the bottom of the trenches located between the raised portions or conductor tracks, respectively. As a result, the first insulation layer is exposed at the bottom of the trenches. The pattern produced is, therefore, covered in places by the first insulation layer and in places by the second insulation layer. Onto this pattern, a layer of a selectively growing material is applied. When the layer of the selectively growing material is being applied, the first and second insulation layer are growth-promoting and growth-inhibiting, respectively, in the sense that the growth rate of the layer of selectively growing material to be applied is greater over the first insulation layer than over the second one.

If the second insulation layer is to be removed at the bottom of the trenches but not at the top of the raised portions, a resist mask must be applied and patterned in such a manner that the raised portions are covered by the mask whereas the trenches are exposed. This requires a corresponding additional effort in the production of integrated circuits. If this effort is avoided and, instead, the bottom of the trenches without masking is exposed with the aid of anisotropic etching, the second, growth-inhibiting layer is also removed from the top of the raised portions. When the selectively growing layer is then applied, the growth rate there is greater than desired. Another application of the growth-inhibiting material to the surface of the raised portions would again entail corresponding additional effort. The additional effort arising in both cases is due to the fact that the growth-inhibiting layer is removed exclusively at the bottom of the trenches, i.e. precisely where it is most inaccessible.

SUMMARY OF THE INVENTION

It is accordingly an object of the invention to provide a deposition of various base layers for selective layer growth in semiconductor production which overcomes the above-mentioned disadvantages of the prior art methods of this general type.

With the foregoing and other objects in view there is provided, in accordance with the invention, a method for shrink-hole-free filling of a trench. The method includes the step of providing a semiconductor substrate having raised portions with flattened top surfaces and trenches with bottom surfaces formed therein, the flattened top surfaces of the raised portions and the bottom surfaces of the trenches being formed substantially parallel to the semiconductor substrate. At least sides of the raised portions are covered with a growth-inhibiting layer. A growth-promoting layer is formed by anisotropic treatment on surfaces parallel to the substrate including the flattened top surfaces of the raised portions and the bottom surfaces of the trenches. The growth-promoting layer is removed from the flattened top surfaces of the raised portions. A layer of a selective growing material is applied simultaneously to the growth-promoting layer and to the growth-inhibiting layer.

In the method according to the invention, a pattern is provided with raised portions and is prepared in the simplest possible manner for the application of a layer of a selective growing material. The pattern is intended to exhibit a growth-inhibiting layer on the top and the side walls of raised portions and a growth-promoting layer at the bottom of trenches between the raised portions. It should be possible to produce this pattern in as time-saving and cost-saving a manner as possible.

According to the invention, the object is achieved by the fact that, after the growth-inhibiting layer has been applied, the growth-promoting layer is generated by anisotropic treatment on surfaces parallel to the substrate on and between the raised portions and the layer is then removed again on the surfaces on the raised portions which are parallel to the substrate. According to the invention, the sequence of application of the growth-promoting layer and the growth-inhibiting layer is reversed. First, the growth-inhibiting layer is applied and only then the growth-promoting layer is generated perpendicularly to the surface of the semiconductor substrate at the bottom of the trenches and on the top of the raised portions with the aid of anisotropic treatment. Due to this sequence, it is the growth-promoting layer that is located at the bottom of the trenches after the deposition of both layers and, therefore, no further processing is required there. The growth-promoting layer, which has also been generated on the top of the raised portions by dispensing with masking can now be removed much more easily than in the previously known method at the bottom of the trenches.

A preferred embodiment provides that the growth-promoting layer is removed by chemical/mechanical polishing on the surfaces parallel to the substrate on the raised portions. The polishing process can be very brief, depending on the deposited thickness of the growth-promoting layer.

A further development of the invention provides that the growth-inhibiting layer is converted on the surface into the growth-promoting layer on the surfaces parallel to the substrate. This can be done, for example, with the aid of an oxygen plasma or by low-energy implantation of oxygen into the growth-inhibiting layer.

With regard to the materials used, preferred embodiments provide that the growth-promoting layer consists predominantly of silicon or silicon oxide and the growth-inhibiting layer consists predominantly of silicon nitride, the silicon nitride preferably being converted into silicon oxide by the implantation of oxygen.

The raised portions are typically conductive patterns of a metalization layer, in which case the selectively growing material forms an insulation between successive metal layers. However, the raised portions can also be conductive gate patterns on which a first oxide layer is applied below the metalization.

The selective growing material is preferably deposited out of an atmosphere containing ozone and TEOS (tetraethyleneorthosilicate) and silicate glass doped with boron and phosphorus.

Other features which are considered as characteristic for the invention are set forth in the appended claims.

Although the invention is illustrated and described herein as embodied in a deposition of various base layers for selective layer growth in semiconductor production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
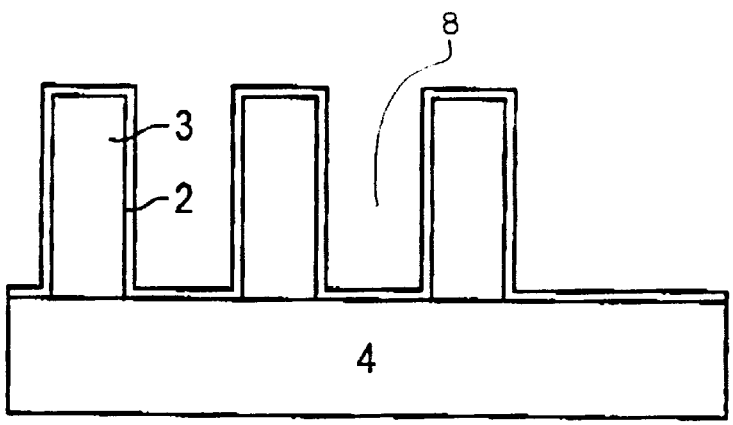
FIGS. 1A–1C are diagrammatic, sectional views of a conventional method for shrink-hole-free filling of trenches.
Figure 1B:
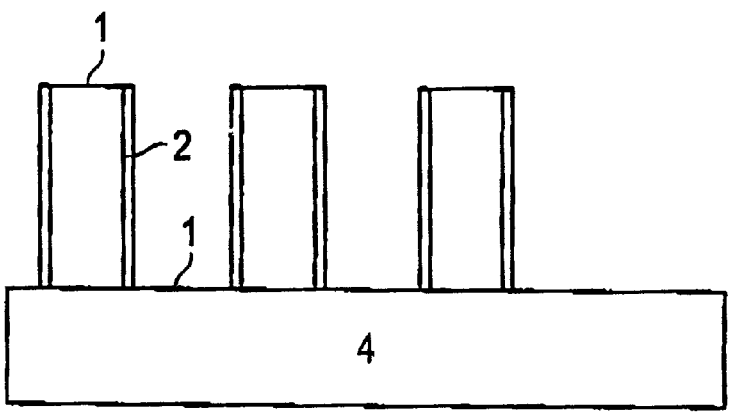
Figure 1C:
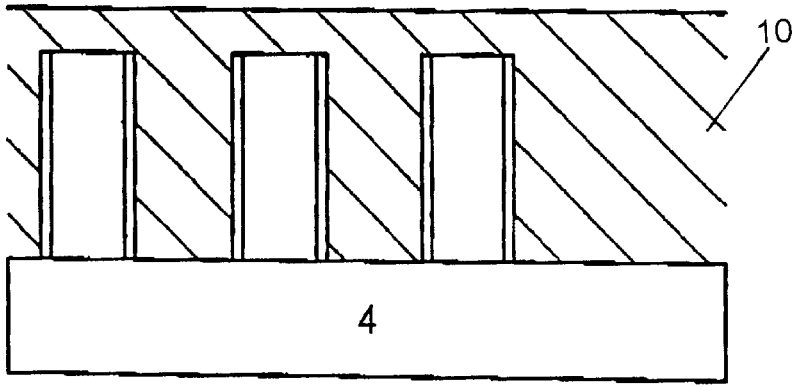

In all the figures of the drawing, sub-features and integral parts that correspond to one another bear the same reference symbol in each case. Referring now to the figures of the drawing in detail and first, particularly, to FIG. 1A thereof, there is shown raised portions 3 patterned on a semiconductor substrate 4 that are conductor tracks of a metalization plane. The raised portions 3 are initially covered with a growth-inhibiting layer 2 of, for example, silicon nitride, producing the pattern shown in FIG. 1A. Silicon nitride has the advantage that, as a diffusion barrier for ions migrating in the crystal lattice, it protects space charge zones existing in the components against ion enrichment, which would change the behavior of the components. In addition, the growth rate of borophosphorus silicate glass (BPSG) on silicon nitride is clearly less than on silicon or silicon oxide, so that silicon nitride can be used in a growth-inhibiting manner. To remove the growth inhibiting layer 2 from bottom of the trenches 8, it is anisotropically etched with the aid of reactive ions, exposing polysilicon or, respectively, silicon dioxide 1 not only at the bottom of the trenches 8 but also on the top of the metal tracks 3 (see FIG. 1B). BPSG grows more quickly on these material than on silicon nitride. A selective deposition of BPSG 10 provides the pattern shown in FIG. 1C and idealized; a real structure would still exhibit slight raised portions above the conductor tracks.

Figure 2A:
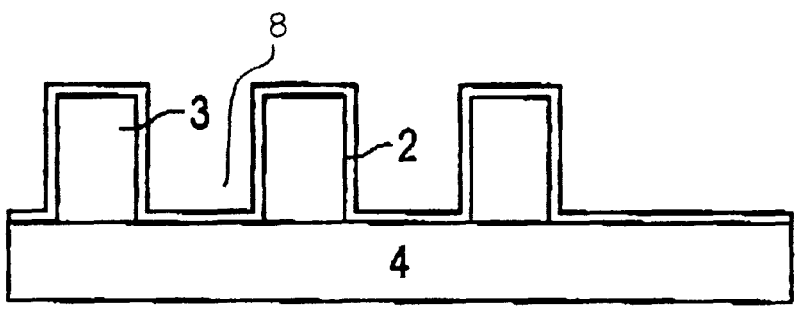
FIGS. 2C to 2C are sectional views for shrink-hole-free filling of the trenches according to the invention.
Figure 2B:
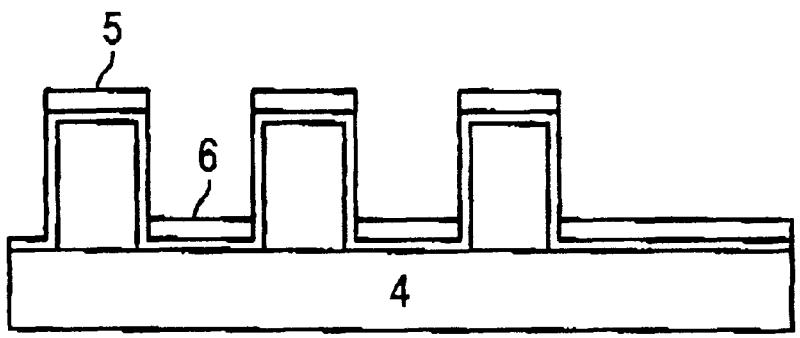
Figure 2B:
Figure 2C:
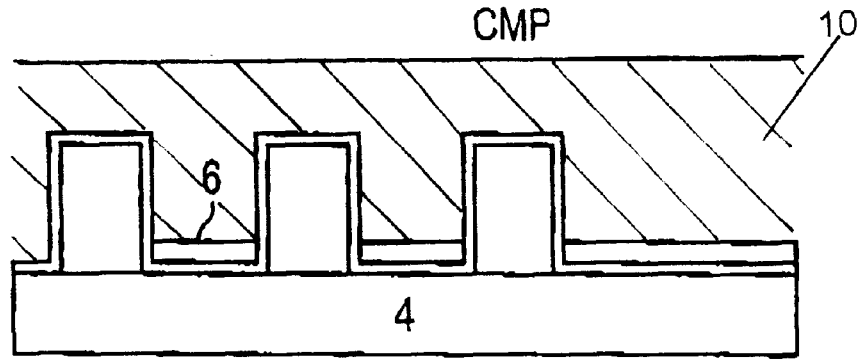

FIGS. 2A to 2B show an integrated semiconductor circuit in three phases of the method according to the invention. The substrate 4 provided with the patterned conductor tracks 3 is first covered with the growth-inhibiting layer 2 of silicon nitride over its whole area. This pattern does not need to contain the growth-promoting layer 1 below the silicon nitride 2 at the bottom of the trenches 8 between the conductor tracks. A growth-promoting layer 5, 6 of silicon oxide is only generated by anisotropic treatment at the bottom of the trenches 8 and on the top of the raised portions 3 as shown in FIG. 2B. The growth-promoting layer 5 generated can be easily removed from the top of the raised portions 3 by chemical/mechanical polishing, the growth-promoting layer 6 at the bottom of the trenches 8 being protected by the raised portions 3. This produces the pattern shown in FIG. 2C on which the selectively growing material 10 can be deposited as in FIG. 1C.

The method according to the invention is suitable for technologies having pattern widths below 0.25 micrometers. It is thus possible to fill trenches having a width of 40 nanometers and an aspect ratio of distinctly greater than 6:1.

We claim:

1. A method for shrink-hole-free filling of a trench, which comprises the steps of:

providing a semiconductor substrate having raised portions with flattened top surfaces and trenches with bottom surfaces formed therein, the flattened top surfaces of the raised portions and the bottom surfaces of the trenches being formed substantially parallel to the semiconductor substrate;

covering at least sides of the raised portions with a growth-inhibiting layer;

forming a growth-promoting layer by anisotropic treatment on surfaces parallel to the substrate including the flattened top surfaces of the raised portions and the bottom surfaces of the trenches;

removing the growth-promoting layer from the flattened top surfaces of the raised portions; and applying a layer of a selective growing material simultaneously to the growth-promoting layer and to the growth-inhibiting layer.

2. The method according to claim 1, which comprises removing the growth-promoting layer from the flattened top surfaces of the raised portions by chemical/mechanical polishing.

3. The method according to claim 1, which comprises converting the growth-inhibiting layer into the growth-promoting layer on the surfaces parallel to the substrate.

4. The method according to claim 1, which comprises generating the growth-promoting layer with the aid of an oxygen plasma.

5. The method according to claim 1, which comprises generating the growth-promoting layer by low-energy implantation of oxygen.

6. The method according to claim 1, which comprises forming the growth-promoting layer predominantly from a material selected from the group consisting of silicon and silicon oxide.

7. The method according to claim 1, which comprises forming the growth-inhibiting layer predominantly from silicon nitride.

8. The method according to claim 7, which comprises converting the silicon nitride into silicon oxide by an oxygen implantation process.

9. The method according to claim 1, which comprises forming the raised portions as conductive patterns of a metalization layer.

10. The method according to claim 1, which comprises depositing the selective growing material from an atmosphere containing ozone and tetraethyeneorthosilicate (TEOS).

11. The method according to claim 1, which comprises using borophosphorus silicate glass (BPSG) as the selectively growing material.

* * * * *

UNITED STATES PATENT AND TRADEMARK OFFICE
CERTIFICATE OF CORRECTION

PATENT NO. : 6,380,074 B1  
DATED : April 30, 2002  
INVENTOR(S) : Markus Kirchhoff et al.

It is certified that error appears in the above-identified patent and that said Letters Patent is hereby corrected as shown below:

<u>Title page,</u>  
Item [75], should read as follows:  
-- Markus Kirchhoff, Ottendorf-Okrilla; Hans-Peter Sperlich, Dresden; Uwe Schilling, Dresden; Zvonimir Gabric, Zorneding; Oswald Spindler, Vaterstetten; Stephan Wege, Dresden; Hans Glawischnig, München, all of (DE) --

Signed and Sealed this

Eighteenth Day of June, 2002

*Attest:*

JAMES E. ROGAN  
*Director of the United States Patent and Trademark Office*

*Attesting Officer*